(12) United States Patent
Derderian et al.

(10) Patent No.: US 6,861,094 B2
(45) Date of Patent: Mar. 1, 2005

(54) METHODS FOR FORMING THIN LAYERS OF MATERIALS ON MICRO-DEVICE WORKPIECES

(75) Inventors: Garo J. Derderian, Boise, ID (US); Gurtej Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 147 days.

(21) Appl. No.: 10/133,909

(22) Filed: Apr. 25, 2002

(65) Prior Publication Data

US 2003/0203626 A1 Oct. 30, 2003

(51) Int. Cl.⁷ .............................................. C23C 16/00
(52) U.S. Cl. ..................................... 427/248.1; 427/96
(58) Field of Search .............................. 427/248.1, 96, 427/255.11

(56) References Cited

U.S. PATENT DOCUMENTS

| | | | |
|---|---|---|---|
| 5,131,752 A | 7/1992 | Yu et al. | |
| 5,200,023 A | 4/1993 | Gifford et al. | |
| 5,377,429 A | 1/1995 | Sandhu et al. | |

(List continued on next page.)

FOREIGN PATENT DOCUMENTS

| | | |
|---|---|---|
| JP | 4-213818 A | 8/1992 |
| WO | WO 99/06610 A1 | 2/1999 |
| WO | WO 00/40772 A1 | 7/2000 |
| WO | WO 00/79019 A1 | 12/2000 |
| WO | WO 02/45871 A1 | 6/2002 |
| WO | WO 02/073329 A2 | 9/2002 |
| WO | WO 03/008662 A2 A3 | 1/2003 |
| WO | WO 03/016587 A1 | 2/2003 |
| WO | WO 03/033762 A1 | 4/2003 |
| WO | WO 03/035927 A2 | 5/2003 |

OTHER PUBLICATIONS

U.S. Appl. No. 09/805,620, Carpenter et al., filed Mar. 13, 2001.
U.S. Appl. No. 09/810,387, Carpenter et al., filed Mar. 15, 2001.
UC Berkeley Extension, Engineering, "Atomic Layer Deposition," Dec. 11, 2001, 5 pages, http://www.unex.berkeley.edu/eng/br335/1–1.html.

(List continued on next page.)

*Primary Examiner*—Bret Chen
(74) *Attorney, Agent, or Firm*—Perkins Coie LLP

(57) ABSTRACT

A method of forming a layer on a micro-device workpiece includes dispensing a first pulse of a first precursor at a first region of the workpiece to flow toward a second region of the workpiece. The second region of the workpiece is located radially outward relative to the first region of the workpiece. The embodiment of this method further includes dispensing a first pulse of a purge gas at the first region of the workpiece to flow toward the second region of the workpiece after terminating the first pulse of the first precursor. Additionally, this embodiment also includes dispensing a second pulse of a first precursor at the second region of the workpiece to flow radially outward concurrently with dispensing the first pulse of a purge gas in the first region of the workpiece. The first pulse of the purge gas is terminated at the first region of the workpiece, and the second pulse of the first precursor is terminated at the second region. At this stage, the method further includes dispensing a first pulse of a second precursor at the first region of the workpiece to flow radially outward toward the second region, and dispensing a second pulse of the purge gas at the second region of the workpiece to flow radially outward concurrently with the first pulse of the second precursor in the first region. A single cycle of the process can further include dispensing a third pulse of the purge gas onto the first region of the workpiece to flow radially outward after terminating the first pulse of the second precursor, and concurrently dispensing a second pulse of the second precursor in the second region to flow radially outward.

29 Claims, 10 Drawing Sheets

U.S. PATENT DOCUMENTS

| | | | |
|---|---|---|---|
| 5,480,818 A | 1/1996 | Matsumoto et al. | |
| 5,589,002 A | 12/1996 | Su | |
| 5,599,513 A | 2/1997 | Masaki et al. | |
| 5,643,394 A | 7/1997 | Maydan et al. | |
| 5,788,778 A | 8/1998 | Shang et al. | |
| 5,792,269 A | 8/1998 | Deacon et al. | |
| 5,851,849 A | 12/1998 | Comizzoli et al. | |
| 5,879,459 A | 3/1999 | Gadgil et al. | |
| 5,908,947 A | 6/1999 | Vaartstra | |
| 5,932,286 A | 8/1999 | Beinglass et al. | |
| 5,968,587 A | 10/1999 | Frankel | |
| 5,972,430 A * | 10/1999 | DiMeo et al. | 427/255.32 |
| 6,042,652 A | 3/2000 | Hyun et al. | |
| 6,059,885 A | 5/2000 | Ohashi et al. | |
| 6,079,426 A | 6/2000 | Subrahmanyam et al. | |
| 6,109,206 A | 8/2000 | Maydan et al. | |
| 6,139,700 A | 10/2000 | Kang et al. | |
| 6,143,659 A | 11/2000 | Leem | |
| 6,144,060 A | 11/2000 | Park et al. | |
| 6,174,377 B1 | 1/2001 | Doering et al. | |
| 6,174,809 B1 | 1/2001 | Kang et al. | |
| 6,203,613 B1 * | 3/2001 | Gates et al. | 117/104 |
| 6,237,529 B1 | 5/2001 | Spahn | |
| 6,270,572 B1 | 8/2001 | Kim et al. | |
| 6,287,965 B1 | 9/2001 | Kang et al. | |
| 6,297,539 B1 | 10/2001 | Ma et al. | |
| 6,305,314 B1 | 10/2001 | Sneh et al. | |
| 6,329,297 B1 | 12/2001 | Balish et al. | |
| 6,342,277 B1 | 1/2002 | Sherman | |
| 6,346,477 B1 * | 2/2002 | Kaloyeros et al. | 438/680 |
| 6,374,831 B1 | 4/2002 | Chandran et al. | |
| 6,387,185 B2 | 5/2002 | Doering et al. | |
| 6,387,207 B1 | 5/2002 | Janakiraman et al. | |
| 6,428,859 B1 | 8/2002 | Chiang et al. | |
| 6,450,117 B1 | 9/2002 | Murugesh et al. | |
| 6,451,119 B2 | 9/2002 | Sneh et al. | |
| 6,461,436 B1 | 10/2002 | Campbell et al. | |
| 6,503,330 B1 | 1/2003 | Sneh et al. | |
| 6,509,280 B2 * | 1/2003 | Choi | 438/778 |
| 6,534,007 B1 | 3/2003 | Blonigan et al. | |
| 6,534,395 B2 | 3/2003 | Werkhoven et al. | |
| 6,540,838 B2 | 4/2003 | Sneh et al. | |
| 6,551,929 B1 | 4/2003 | Kori et al. | |
| 6,562,140 B1 | 5/2003 | Bondestam et al. | |
| 6,573,184 B2 | 6/2003 | Park | |
| 6,579,372 B2 | 6/2003 | Park | |
| 6,579,374 B2 | 6/2003 | Bondestam et al. | |
| 6,630,201 B2 | 10/2003 | Chiang et al. | |
| 6,635,965 B1 * | 10/2003 | Lee et al. | 257/758 |
| 6,638,879 B2 * | 10/2003 | Hsieh et al. | 438/791 |
| 2001/0011526 A1 | 8/2001 | Doering et al. | |
| 2001/0045187 A1 | 11/2001 | Uhlenbrock | |
| 2002/0007790 A1 | 1/2002 | Park | |
| 2002/0043216 A1 | 4/2002 | Hwang et al. | |
| 2002/0052097 A1 | 5/2002 | Park | |
| 2002/0073924 A1 | 6/2002 | Chiang et al. | |
| 2002/0076490 A1 | 6/2002 | Chiang et al. | |
| 2002/0076507 A1 | 6/2002 | Chiang et al. | |
| 2002/0076508 A1 | 6/2002 | Chiang et al. | |
| 2002/0094689 A1 | 7/2002 | Park | |
| 2002/0100418 A1 | 8/2002 | Sandhu et al. | |
| 2002/0104481 A1 | 8/2002 | Chiang et al. | |
| 2002/0108714 A1 | 8/2002 | Doering et al. | |
| 2002/0127745 A1 | 9/2002 | Lu et al. | |
| 2002/0144655 A1 | 10/2002 | Chiang et al. | |
| 2002/0162506 A1 | 11/2002 | Sneh et al. | |
| 2002/0164420 A1 | 11/2002 | Derderian et al. | |
| 2002/0195056 A1 | 12/2002 | Sandhu et al. | |
| 2002/0197402 A1 | 12/2002 | Chiang et al. | |
| 2003/0023338 A1 | 1/2003 | Chin et al. | |
| 2003/0027428 A1 | 2/2003 | Ng et al. | |
| 2003/0027431 A1 | 2/2003 | Sneh et al. | |
| 2003/0066483 A1 | 4/2003 | Lee et al. | |
| 2003/0070609 A1 | 4/2003 | Campbell et al. | |
| 2003/0070617 A1 | 4/2003 | Kim et al. | |
| 2003/0070618 A1 | 4/2003 | Campbell et al. | |
| 2003/0075273 A1 | 4/2003 | Kilpela et al. | |
| 2003/0079686 A1 | 5/2003 | Chen et al. | |
| 2003/0098372 A1 | 5/2003 | Kim | |
| 2003/0098419 A1 | 5/2003 | Ji et al. | |
| 2003/0106490 A1 | 6/2003 | Jallepally et al. | |
| 2003/0121608 A1 | 7/2003 | Chen et al. | |
| 2003/0192645 A1 | 10/2003 | Liu et al. | |

OTHER PUBLICATIONS

IPS Integrated Process Systems, Dec. 11, 2001, 1 page, http://www.ips–tech.com/eng/main.htm.

IPS Integrated Process Systems, Nano–ALD, Dec. 11, 2001, 2 pages, http://www.ips–tech.com/eng/pro–p2.htm.

IPS Integrated Process Systems, Nano–ALD, Dec. 11, 2001, 2 pages, http://www.ips–tech.com/eng/pro–p2–2.htm.

Deublin Company, Precision Rotating Unions, Steam Joints and Siphon Systems "Precision Rotating Connections for Water, Steam, Air, Hydraulic, Vacuum, Coolant and Hot Oil Service," http://www.deublin.com, Feb. 4, 2002, 1 page.

Deublin Company, "Rotating Unions," http://www.deublin.com/products/rotatingunions.htm, Feb. 4, 2002, 1 page.

Deublin Company, "Sealing," http://www.deublin.com/products/sealing.htm, Feb. 4, 2002, 2 pages.

Electronics Times, "Atomic Layer Deposition Chamber Works at Low Temperatures," 2 pages, Dec. 11, 2001, 2001 CMP Europe Ltd., http://www.electronicstimes.com/story/OEG20010719S0042.

The University of Adelaide Australia, Department of Chemistry, Stage 2 Chemistry Social Relevance Projects, "Spectroscopy," 2 pages, Feb. 9, 2002, http://www.chemistry.adelaide.edu.au/external/Soc–Rel/content/Spectros.htm.

* cited by examiner

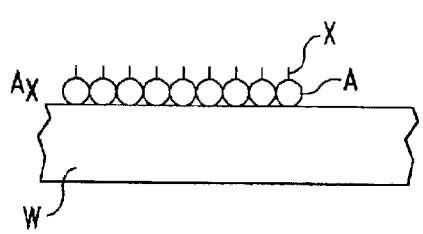
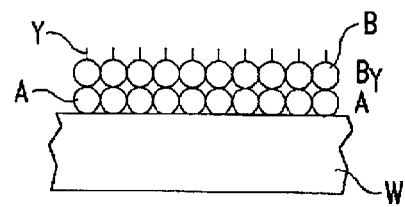
Fig. 1A
(Prior Art)
Fig. 1B
(Prior Art)
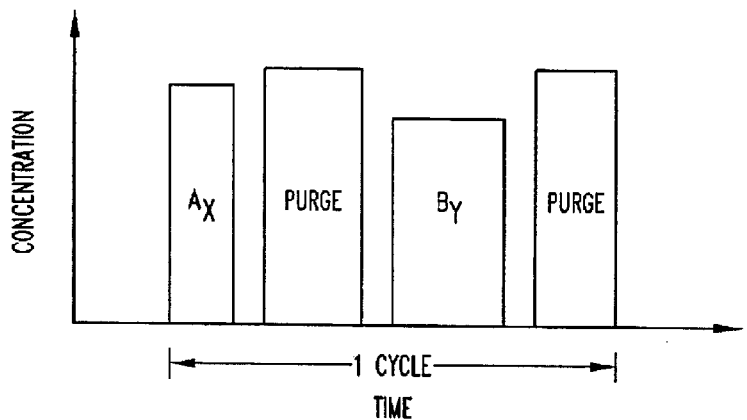
Fig. 2
(Prior Art)
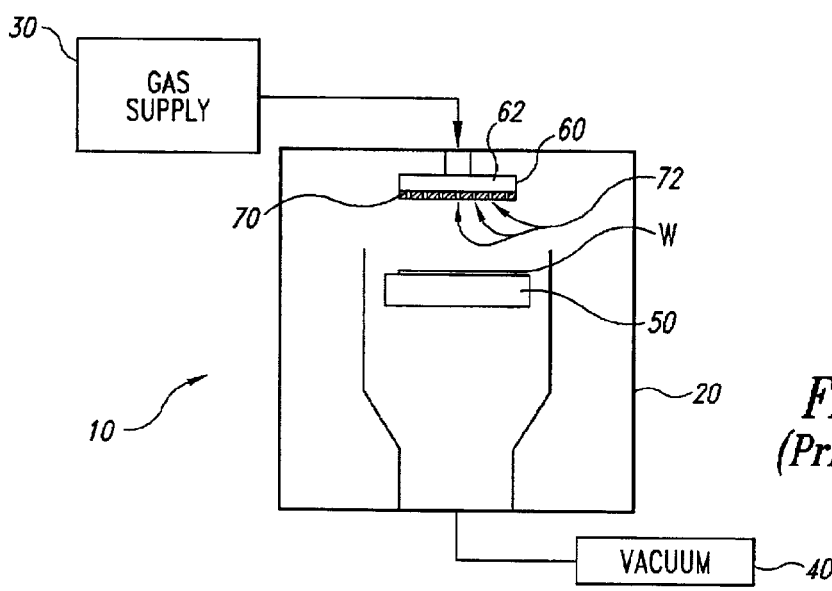
Fig. 3
(Prior Art)

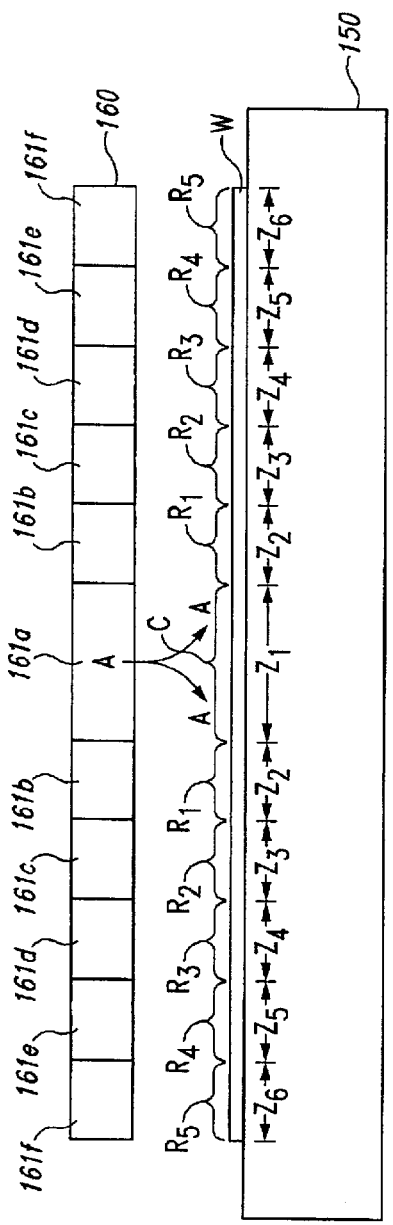
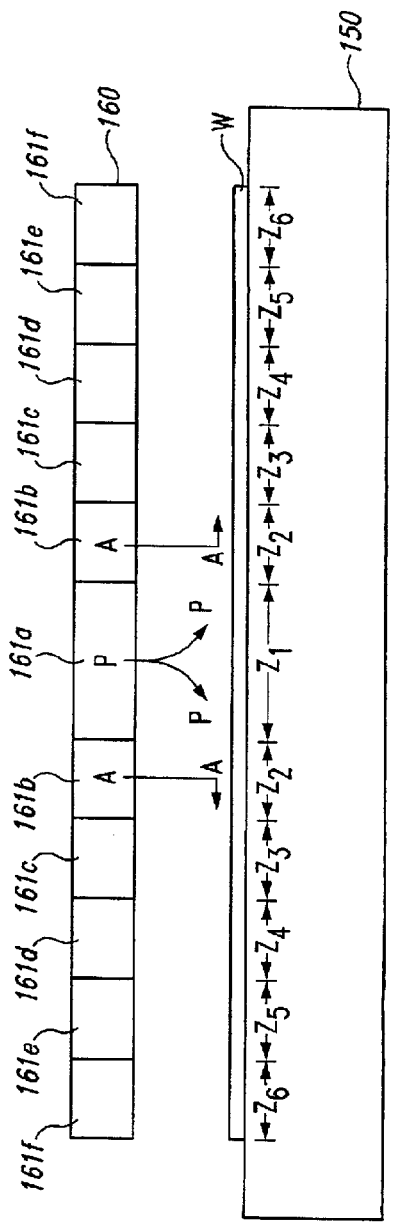
Fig. 6A
Fig. 6B

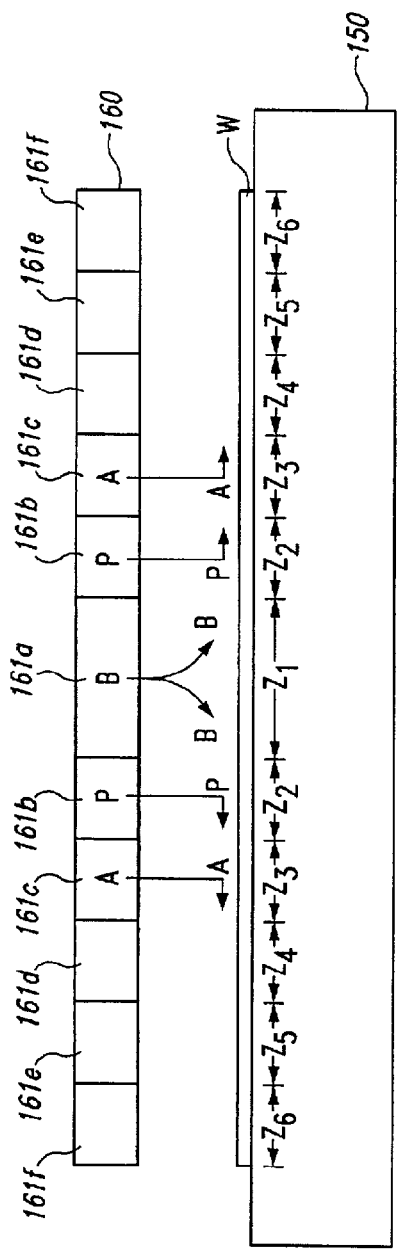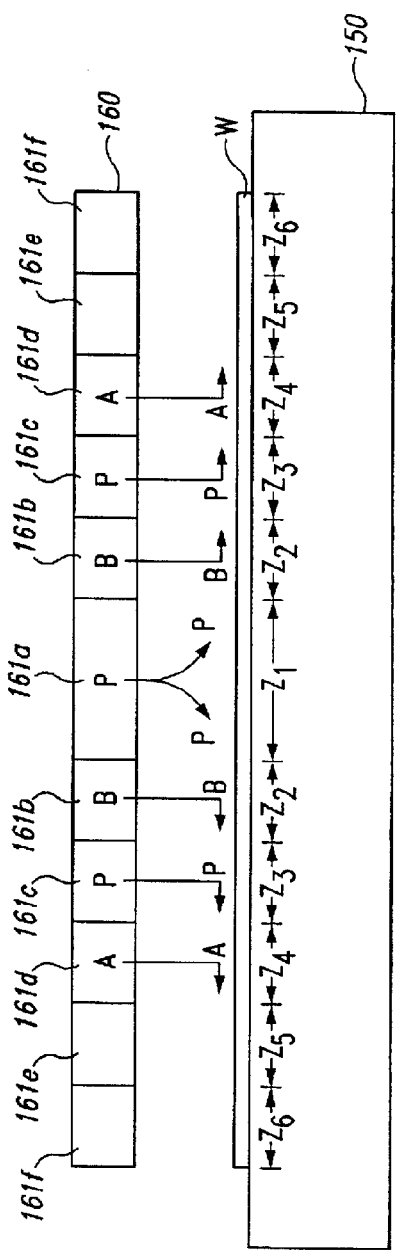

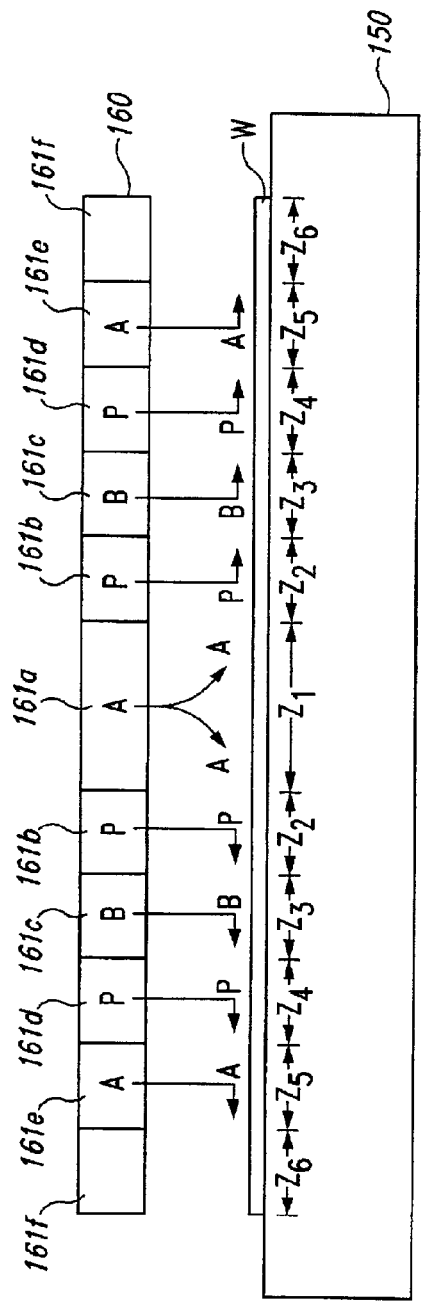
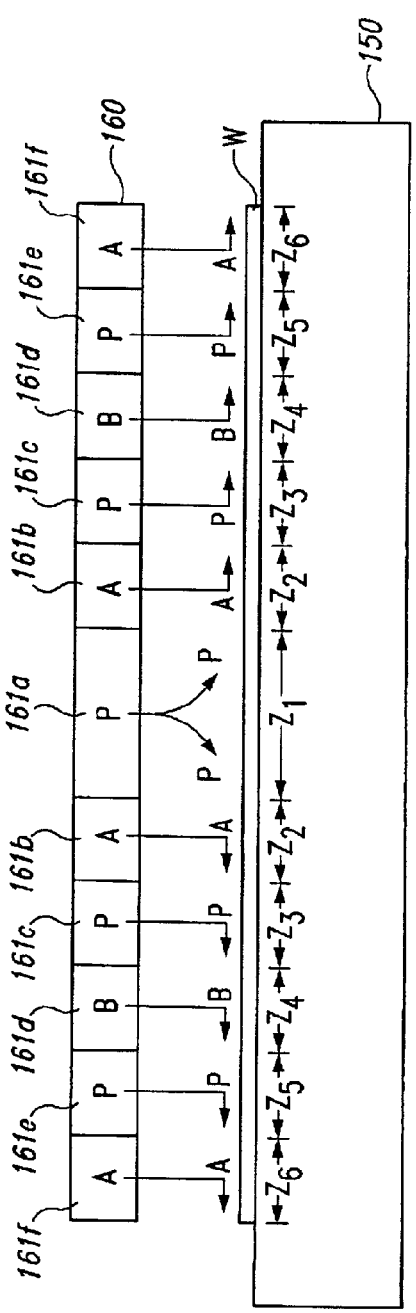
Fig. 6E
Fig. 6F

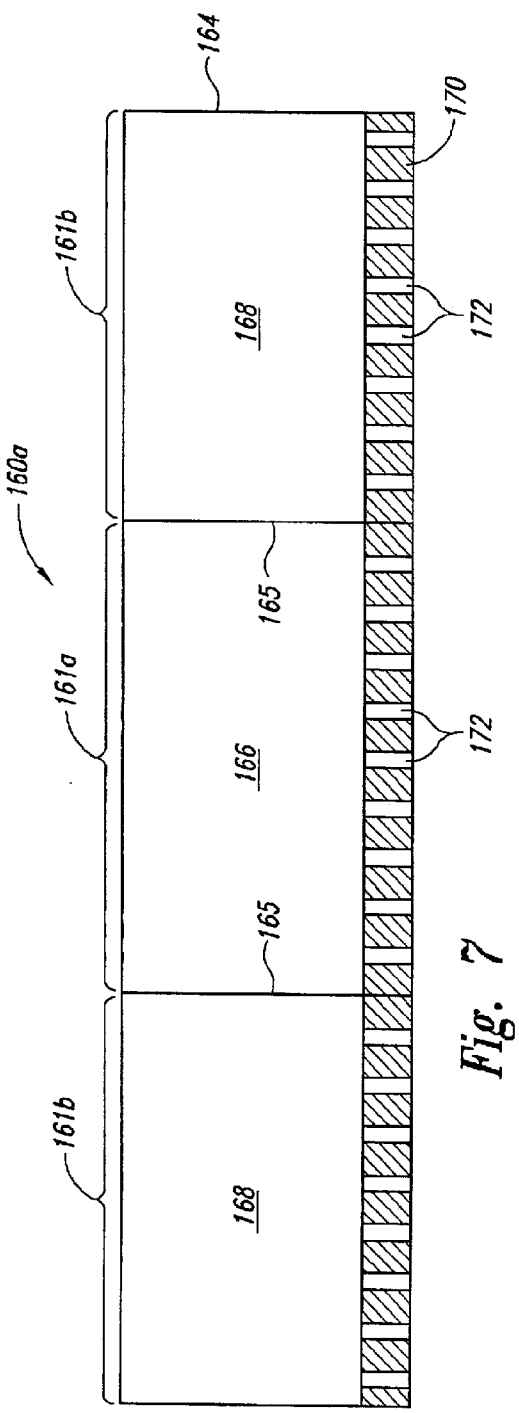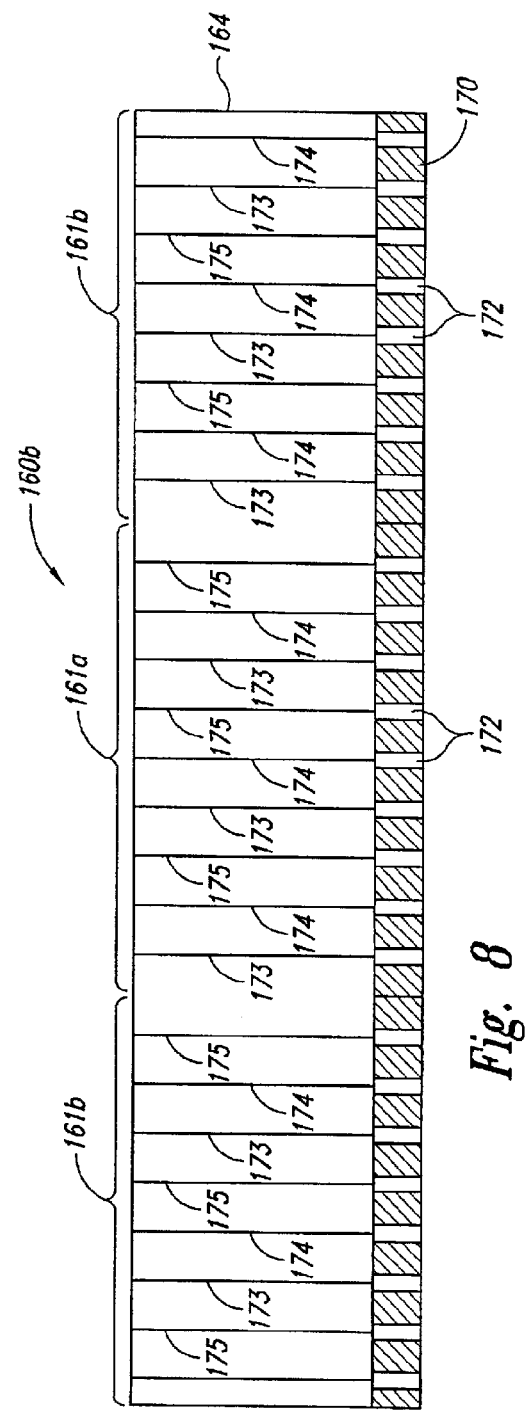

METHODS FOR FORMING THIN LAYERS OF MATERIALS ON MICRO-DEVICE WORKPIECES

TECHNICAL FIELD

The present invention is related to the field of thin film deposition in the manufacturing of microelectronic devices, micromechanical devices and other types of micro-devices.

BACKGROUND

Thin film deposition techniques are widely used in the manufacturing of microelectronic devices to form a coating on a workpiece that closely conforms to the surface typography. The size of the individual components in the devices is constantly decreasing, and the number of layers in the devices is increasing. As a result, the density of components and the aspect ratios of depressions (e.g., the ratio of the depth to the size of the opening) is constantly increasing. The size of the workpieces is also increasing to provide more real estate for forming more dies (i.e., chips) on a single workpiece. Many fabricators, for example, are transitioning from 200 mm to 300 mm workpieces, and even larger workpieces will likely be used in the future. Thin film deposition techniques accordingly strive to produce highly uniform conformal layers that cover the sidewalls, bottoms and corners in deep depressions that have very small openings.

One widely used thin film deposition technique is Chemical Vapor Deposition ("CVD"). In a CVD system, one or more precursors that are capable of reacting to form a solid thin film are mixed in a gas or vapor state, and then the precursor mixture is presented to the surface of the workpiece. The surface of the workpiece catalyzes the reaction between the precursors to form a thin solid film that closely follows the contour of the surface typography on the workpiece. The most common way to catalyze the reaction at the surface of the workpiece is to heat the workpiece to a temperature that causes the reaction.

Although CVD techniques are useful in many applications, they also have several drawbacks. For example, if the precursors are not highly reactive, then a high workpiece temperature is needed to achieve a reasonable deposition rate. Such high temperatures are typically not desirable because heating the workpiece can be detrimental to the structures and other materials that are already formed on the workpiece. Implanted or doped materials, for example, migrate in the silicon substrate when a workpiece is heated. On the other hand, if more reactive precursors are used so that the reaction temperature of the workpiece can be lower, then reactions may occur prematurely in the gas phase before reaching the substrate. This is not desirable because the film quality and uniformity may suffer, and also because it limits the type of precursors that can be used. Thus, CVD techniques may not be appropriate for many thin film applications.

Atomic Layer Deposition ("ALD") is another thin film deposition technique that addresses several of the drawbacks associated with CVD techniques. FIGS. 1A and 1B schematically illustrate the basic operation of ALD processes. Referring to FIG. 1A, a layer of gas molecules $A_x$ coats the surface of a workpiece W. The layer of the $A_x$ molecules is formed by exposing the workpiece W to a first precursor gas containing $A_x$ molecules, and then purging the chamber with a purge gas to remove excess $A_x$ molecules. This process can form a monolayer of $A_x$ molecules on the surface of the workpiece W because the $A_x$ molecules at the surface are held in place during the purge cycle by physical adsorption forces at moderate temperatures or chemisorption forces at higher temperatures. The layer of $A_x$ molecules is then exposed to a second precursor gas containing $B_y$ molecules. The $A_x$ molecules react with the $B_y$ molecules to form an extremely thin solid layer of material on the workpiece W. The chamber is then purged again with a purge gas to remove excess $B_y$ molecules.

FIG. 2 illustrates the stages of one cycle for forming a thin solid layer using ALD techniques. A typical cycle includes (a) exposing the workpiece to the first precursor $A_x$, (b) purging excess $A_x$ molecules, (c) exposing the workpiece to the second precursor $B_y$, and then (d) purging excess $B_y$ molecules. Several cycles are repeated to build a thin film on a workpiece having the desired thickness. For example, each cycle may form a layer having a thickness of approximately 0.5–1.0 Å, and thus it takes approximately 60–120 cycles to form a solid layer having a thickness of approximately 60 Å.

FIG. 3 schematically illustrates an ALD reactor 10 having a chamber 20 coupled to a gas/vapor supply 30 and a vacuum 40. The reactor 10 also includes a heater 50 that supports the workpiece W and a gas dispenser 60 in the chamber 20. The gas dispenser 60 includes a plenum 62 operatively coupled to the gas supply 30. The gas dispenser 60 also includes a distributor plate 70 having a plurality of holes 72. In operation, the heater 50 heats the workpiece W to a desired reaction temperature, and the gas supply 30 selectively injects the first precursor $A_x$, the purge gas, and the second precursor $B_y$ as shown above in FIG. 2. The vacuum 40 maintains a negative pressure in the chamber to draw the gasses from the gas distributor 60 across the workpiece W and then through an outlet of the chamber 20.

One drawback of ALD processing is that the film thickness may be different at the center of the workpiece than at the periphery. To overcome this problem, the center of some distributor plates do not have any holes 72. In practice, however, this may cause the film at the center of the workpiece to be thinner than the film at the periphery. Moreover, the center portion of such plates may become coated with the solid material because it is difficult to purge all of the precursors from this portion of the gas distributor 60 during normal purge cycles.

Another drawback of ALD processing is that it has a low throughput compared to CVD techniques. For example, ALD processing typically takes about eight to eleven seconds to perform each $A_x$-purge-$B_y$-purge cycle. This results in a total process time of approximately eight to eleven minutes to form a thin layer of only 60 Å. In contrast to ALD processing, CVD techniques only require about one minute to form a 60 Å thick layer. The low throughput of existing ALD techniques limits the utility of this technology in its current state because ALD may be a bottleneck in the fab. Thus, it would be useful to increase the throughput of ALD techniques so that they can be used in a wider range of applications.

SUMMARY

The present invention is directed toward reactors for depositing materials onto a micro-device workpiece, systems that include such reactors, and methods for depositing materials onto micro-device workpieces. In one embodiment, a method of forming a layer on a micro-device workpiece includes dispensing a first pulse of a first precursor at a first region of the workpiece to flow toward a second region of the workpiece. The second region of the workpiece is located radially outward relative to the first region of the workpiece. This embodiment further includes dispensing a first pulse of a purge gas at the first region of the workpiece to flow toward the second region of the workpiece after terminating the first pulse of the first precursor, and concurrently dispensing a second pulse of a first precursor at the second region of the workpiece to flow radially outward while dispensing the first pulse of the purge gas in the first region of the workpiece. The first pulse of the purge gas and the second pulse of the first precursor are then terminated. This embodiment further includes dispensing a first pulse of a second precursor at the first region of the workpiece to flow radially outward toward the second region, and concurrently dispensing a second pulse of the purge gas at the second region of the workpiece to flow radially outward while dispensing the first pulse of the second precursor in the first region. This embodiment continues by dispensing a third pulse of the purge gas onto the first region of the workpiece to flow radially outward after terminating the first pulse of the second precursor, and concurrently dispensing a second pulse of the second precursor in the second region to flow radially outward while dispensing the third pulse of the purge gas.

This embodiment accordingly provides a continuous pulse train in which discrete areas of the workpiece are exposed to one of the first or second precursors while adjacent areas are exposed to the purge gas. A continuous pulse train can accordingly be presented to the surface of the wafer without having to completely purge the first and second precursors from the entire surface area of the workpiece during each purge cycle. This is expected to greatly reduce the processing time for forming a layer of material on the workpiece.

Another aspect of the invention is directed toward a reactor for forming a layer of material on a micro-device workpiece. In one embodiment, a reactor includes a reaction chamber having an inlet and an outlet, and a workpiece support in the reaction chamber between the inlet and the outlet. The workpiece support can have a first zone and a second zone. The second zone is located radially outward relative to the first zone. The reactor can further include a gas distributor in the reaction chamber between the inlet and the workpiece support. The gas distributor can comprise a first dispensing section and a second dispensing section. The second dispensing section is located radially outward relative to the first dispensing section. The first dispensing section is configured to dispense separate pulses of a first precursor, a purge gas, or a second precursor over the first zone of the workpiece support. The second dispensing section is configured to dispense separate pulses of the first precursor, the purge gas, or the second precursor over the second zone of the workpiece support independently from the type of gas dispensed from the first dispensing section. As such, the first dispensing section can dispense one type of gas over the first zone while the second dispensing section concurrently dispenses a different type of gas over the second zone.

The reactor can be part of a system that further includes a gas supply assembly and a controller coupled to the gas supply assembly. The gas supply assembly can include a first gas source for a first precursor, a second gas source for a second precursor, and a third gas source for a purge gas. The controller can contain computer readable instructions that cause the first precursor, second precursor and purge gas to flow through the first and second dispensing sections of the gas distributor in a manner that effectuates embodiments of methods in accordance with the invention.

BRIEF DESCRIPTION OF THE DRAWINGS

FIGS. 1A and 1B are schematic cross-sectional views of stages in atomic layer deposition processing in accordance with the prior art.

FIG. 2 is a graph illustrating a cycle for forming a layer using atomic layer deposition in accordance with the prior art.

FIG. 3 is a schematic representation of a system including a reactor for depositing a material onto a microelectronic workpiece in accordance with the prior art.

FIGS. 6A–6I are schematic cross-sectional views of another method for depositing a material onto a micro-device workpiece in accordance with another embodiment of the invention.

FIG. 7 is a schematic cross-sectional view of a gas distributor for depositing a material onto a micro-device workpiece in accordance with an embodiment of the invention.

FIG. 8 is a schematic cross-sectional view of another gas distributor for depositing a material onto a micro-device workpiece in accordance with yet another embodiment of the invention.

DETAILED DESCRIPTION

The following disclosure describes several embodiments of reactors for depositing a material onto a micro-device workpiece, systems including such reactors, and methods for depositing materials onto micro-device workpieces. Many specific details of the invention are described below with reference to depositing materials onto micro-device workpieces. The term "micro-device workpiece" is used throughout to include substrates upon which and/or in which microelectronic devices, micromechanical devices, data storage elements, read/write components, and other features are fabricated. For example, micro-device workpieces can be semiconductor wafers such as silicon or galium arsenide wafers, glass substrates, insulative substrates, and many other types of materials. The term "gas" is used throughout to include any form of matter that has no fixed shape and will conform in volume to the space available, which specifically includes vapors (i.e., a gas having a temperature less than the critical temperature so that it may be liquified or solidified by compression at a constant temperature). Additionally, several aspects of the invention are described with respect to Atomic Layer Deposition ("ALD"), but certain aspects may be applicable to other types of deposition processes. Several embodiments in accordance with the invention are set forth in FIGS. 4–8 and the following text to provide a thorough understanding of particular embodiments of the invention. A person skilled in the art will understand, however, that the invention may have additional embodiments, or that the invention may be practiced without several of the details of the embodiments shown in FIGS. 4–8.

A. Deposition Systems

Figure 4:
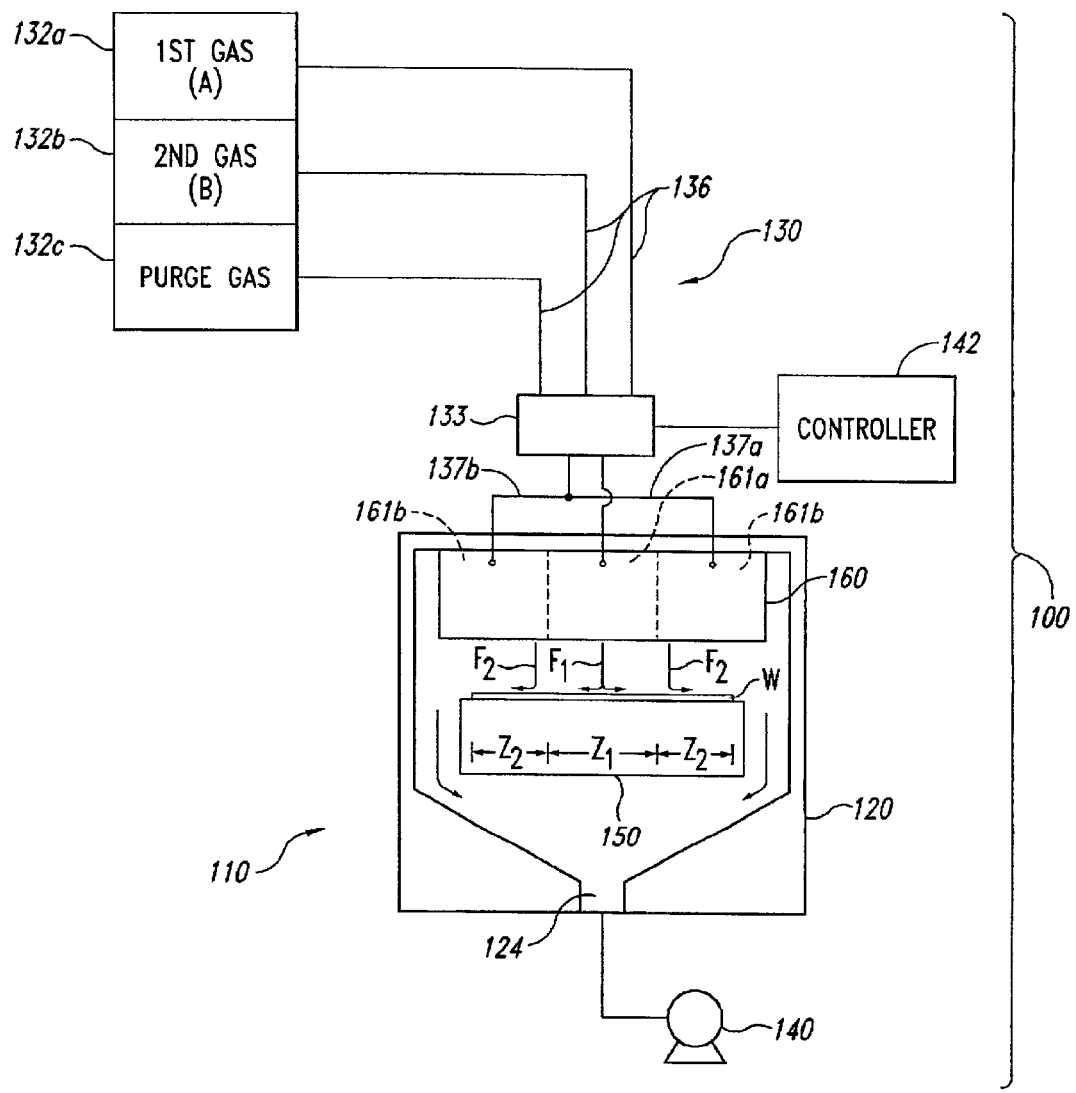
FIG. 4 is a schematic representation of a system having a reactor for depositing a material onto a micro-device workpiece in accordance with one embodiment of the invention.

FIG. 4 is a schematic representation of a system 100 for depositing a material onto a micro-device workpiece in accordance with an embodiment of the invention. In this embodiment, the system 100 includes a reactor 110 having a reaction chamber 120 coupled to a gas supply 130 and a vacuum 140. For example, the reaction chamber 120 can have an inlet 122 coupled to the gas source assembly 130 and an outlet 124 coupled to the vacuum 140.

The gas supply 130 includes a plurality of gas sources 132 (identified individually as 132a–c), a valve assembly 133 having a plurality of valves, and a plurality of gas lines 136 and 137. The gas sources 132 can include a first gas source 132a for providing a first precursor A, a second gas source 132b for providing a second precursor B, and a third gas source 132c for providing a purge gas P. The first and second precursors A and B are the gas or vapor phase constituents that react to form the thin, solid layer on the workpiece W. The purge gas P can be a suitable type of gas that is compatible with the reaction chamber 120 and the workpiece W. The gas supply 130 can include more gas sources 132 for applications that require additional precursors or purge gases in other embodiments. As explained in more detail below, the valve assembly is operated by a controller 142 that generates signals for pulsing the individual gases through the reaction chamber 120.

The reaction chamber 110 in the embodiment illustrated in FIG. 4 also includes a workpiece support 150 and a gas distributor 160 in the reaction chamber 120. The workpiece support 150 is typically heated to bring the workpiece W to a desired temperature for catalyzing the reaction between the first precursor A and the second precursor B at the surface of the workpiece W. The workpiece support 150 is a plate with a heating element in one embodiment of the reaction chamber 120. The workpiece support 150, however, may not be heated in other applications. The workpiece support 150 has a first zone $Z_1$ at a central portion C of the workpiece W and a second zone $Z_2$ at an outer portion of the workpiece W. The second zone $Z_2$ in the embodiment shown in FIG. 4 is an annular region radially outward from the first zone $Z_1$. The workpiece support 150 can have more than two zones in other embodiments as explained below with reference to FIGS. 6A–6I.

The gas distributor 160 is positioned at the inlet 122 of the reaction chamber 120. The gas distributor 160 includes a first dispensing section 161a and a second dispensing section 161b. The first dispensing section 161a is generally juxtaposed to the first zone $Z_1$, and the first dispensing section 161a is coupled to the valve assembly 133 to dispense at least one of the first precursor A, the second precursor B, or the purge gas P over the first zone $Z_1$. The first dispensing section 161a can have a circular shape to create a gas flow $F_1$ that flows radially outward from the center region C of the workpiece W. The second dispensing section 161b can have an annular shape that concentrically surrounds the first dispensing section 161a to be juxtaposed to the second zone $Z_2$. The second dispensing section 161b is coupled to the valve assembly 133 to dispense a different one of the first precursor A, the second precursor B, or the purge gas P over the second zone $Z_2$ independently from the first dispensing section 161a. The second dispensing section 161b accordingly produces a second gas flow $F_2$ that flows radially outward across the workpiece W. In operation, the first dispensing section 161a can dispense a pulse of one type of gas over the first zone $Z_1$ while the second dispensing section 161b simultaneously dispenses a pulse of a different type of gas over the second zone $Z_2$. The separate pulses of gases that form the gas flows $F_1$ and $F_2$ are coordinated to provide the desired combination of gases at separate regions on the surface of the workpiece. For example, pulse trains of different gases are dispensed through each of the first and second dispensing sections 161a-b concurrently to provide a continuous deposition process that does not completely purge the first and/or the second precursor from the entire surface of the workpiece until the end of the deposition process.

B. Methods for Forming Layers on Micro-Device Workpieces

The system 100 shown in FIG. 4 can be used to perform several different methods for forming layers on micro-device workpieces. In one embodiment, the system 100 provides a continuous pulse train that dispenses pulses of the first precursor, the second precursor and the purge gas in a manner that causes the pulses of gases to flow radially outward across the workpiece. The pulse train of gases is controlled to concurrently dispense the purge gas to various zones of the workpiece while separately dispensing at least one of the first or second precursors to another zone of the workpiece. It is anticipated that providing a continuous pulse train that concurrently dispenses the purge gas and the precursors to the workpiece will reduce the cycle time for building a layer.

Figure 5A:
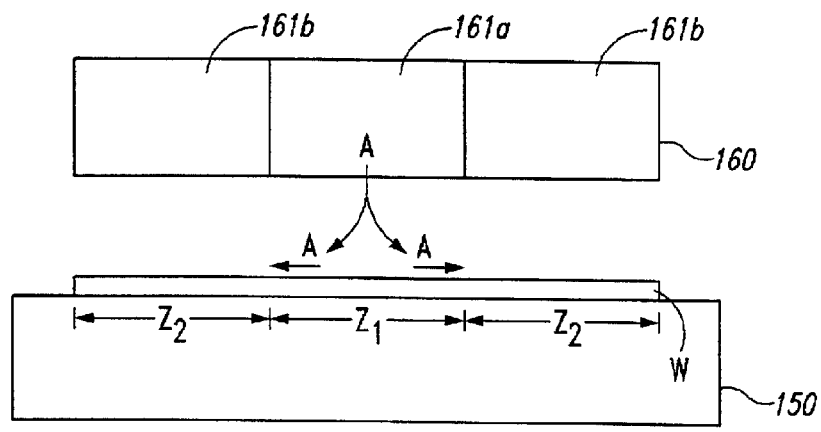
FIGS. 5A–5E are schematic cross-sectional views illustrating a method for depositing a material onto a micro-device workpiece using the system of FIG. 4 in accordance with one embodiment of the invention.
Figure 5B:
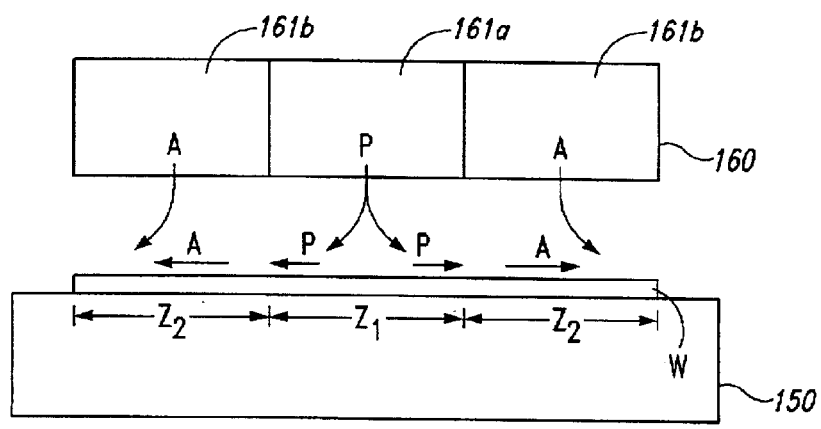

FIGS. 5A–5E illustrate one embodiment of a method that the system 100 can perform to provide a continuous pulse train of precursors and purge gas to the workpiece W. Referring to FIG. 5A, this embodiment includes dispensing a first pulse of the first precursor A from the first dispensing section 161a. The first pulse of the first precursor A flows downward to the workpiece W and then radially outward from a center region of a workpiece aligned with the first zone $Z_1$ of the support 150. FIG. 5B illustrates a subsequent stage of the method that includes dispensing a first pulse of the purge gas P from the first dispensing section 161a after terminating the first pulse of the first precursor A, and concurrently dispensing a second pulse of the first precursor A from the second dispensing section 161b. The first pulse of the purge gas P flows radially outward above the first zone $Z_1$, and the second pulse of the first precursor A flows radially outward across a first outer region of the workpiece W over the second zone $Z_2$. The first pulse of the purge gas P accordingly purges excess molecules of the first precursor A from the center portion of the workpiece over the zone $Z_1$, and the second pulse of the first precursor A simultaneously covers the outer region of the workpiece in the zone $Z_2$.

Figure 5C:
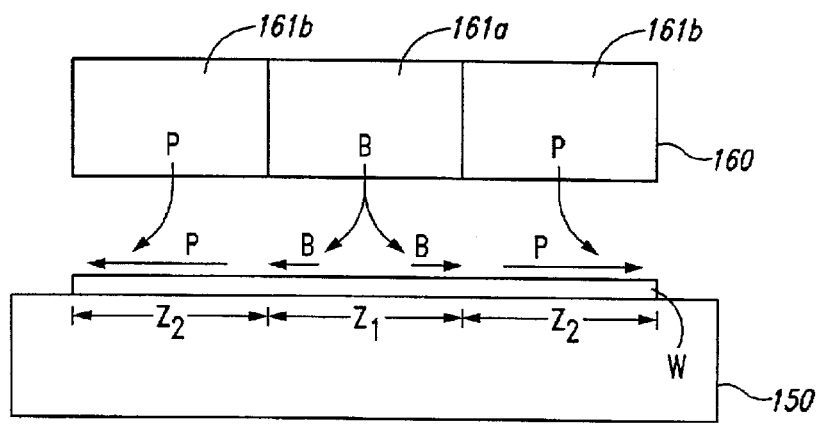

FIG. 5C illustrates a stage of the method that occurs after the stage shown in FIG. 5B. This stage of the method includes dispensing a first pulse of the second precursor B from the first dispensing section 161a and concurrently dispensing a second pulse of the purge gas P from the second dispensing section 161b. The first pulse of the second precursor typically begins after terminating the first pulse of the purge gas and flows radially outward from the center region. The first pulse of the second precursor B accordingly reacts with the molecules of the first precursor A that remain on the workpiece W over the zone $Z_1$ to form a solid layer in the center region of the workpiece W. The second pulse of the purge gas flows radially outward to purge excess molecules of the second pulse of the first precursor A (shown in FIG. 5B) from the outer region of the workpiece over the second zone $Z_2$.

Figure 5D:
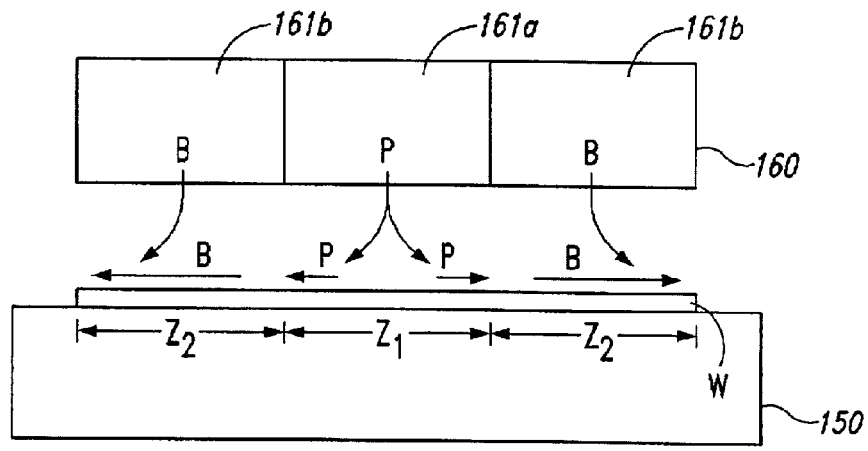

FIG. 5D illustrates still a later stage of this method that includes dispensing a third pulse of the purge gas P from the first dispensing section 161a and concurrently dispensing a second pulse of the second precursor B from the second dispensing section 161b. The third pulse of the purge gas P flows downwardly to the center region of the workpiece W over the first zone $Z_1$, and then it flows radially outward. The second pulse of the second precursor B flows radially outward through the first outer region of the workpiece over the second zone $Z_2$. The second pulse of the second precursor B accordingly reacts with the molecules of the first precursor A that remain on the workpiece W over the second zone $Z_2$ to continue forming the solid layer in the outer region of the workpiece. The stages of the method shown in FIGS. 5A–5D accordingly form a very thin layer of material on the workpiece.

Figure 5E:
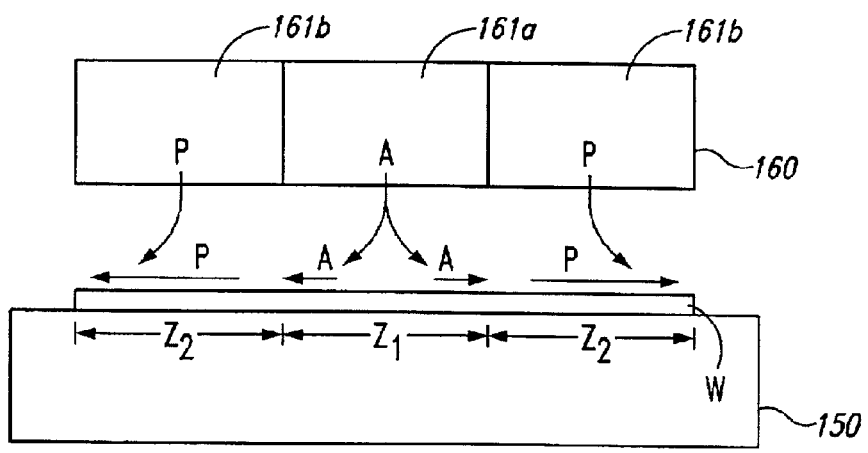

FIG. 5E illustrates a later stage of this method in which the pulse train is repeated by dispensing another pulse of the first precursor A from the first dispensing section 161a, and concurrently dispensing another pulse of the purge gas P from the second dispensing section 161b. The method can continue by repeating the foregoing stages until the thickness of the deposited layer is within a desired range.

The particular embodiment of the method shown in FIGS. 5A–5E is expected to reduce the cycle time for separately dispensing the first and second precursors to the surface of the workpiece W. Many conventional processes typically purge excess molecules of one type of precursor from the entire surface of the workpiece before introducing the other type of precursor as explained above with reference to FIG. 2. The embodiment of the method set forth in FIGS. 5A–5E is expected to require less time because it does not purge the excess of one precursor from the entire area over the workpiece before introducing a pulse of the other precursor. This embodiment accordingly does not need the long purge pulses that are used in conventional ALD processing. The first and second precursors, however, are still inhibited from mixing except at the surface of the workpiece W. Therefore, the method set forth in FIGS. 5A–5E is expected to provide the advantages of conventional ALD processing with a shorter cycle time to improve the throughput.

Another embodiment of the method for forming layers on micro-device workpieces shown in FIGS. 5A–5E involves adjusting the concentration of the pulses of the first precursor A, the second precursor B, and/or the purge gas P relative to the location on the workpiece W. The concentration of the particular pulses can be adjusted by controlling the mass transfer rate of the various gases from the first and second dispensing sections 161a and 161b. For example, the first pulse of the first precursor A shown in FIG. 5A and the first pulse of the second precursor B shown in FIG. 5C from the first dispensing section 161a can be at a relatively high mass transfer rate to increase the concentration of precursor molecules over the center region of the workpiece. The second pulse of the first precursor A from the second dispensing section 161b shown in FIG. 5B, and the second pulse of the second precursor B from the second dispensing section 161b shown in FIG. 5E can be at lower mass transfer rates because some of the molecules from the first pulses of these precursors will flow from the center region of the workpiece W to the first outer region of the workpiece W. One particular embodiment of a method in accordance with the invention can accordingly provide a continuous pulse train that maintains the same concentration of precursor molecules across the surface of the workpiece. Such an embodiment can include increasing or decreasing the concentration of the precursors with increasing radius across the workpiece. For example, the concentration of the precursors can decrease with each pulse at an increasing radial location. This is expected to be particularly useful because reducing the amount of precursors reduces the number of molecules that must be purged from each region of the workpiece by the pulses of purge gas. Additionally, reducing the concentration of the precursors with increasing radius is expected to reduce the consumption of precursors. As a result, this particular embodiment of the method is expected to produce a highly uniform layer on the surface of the workpiece W because it can continuously control the saturation of the precursors across the workpiece.

FIGS. 6A–6I illustrate a method for forming a layer on a micro-device workpiece in accordance with another embodiment of the invention. The embodiments of the method illustrated in FIGS. 6A–6I can be performed using the system 100 set forth above with respect to FIG. 4. The gas distributor 160 in this embodiment, however, includes six separate gas dispensing sections 161a–f. The first dispensing section 161a is located over a center region C of the workpiece W that is aligned with the first zone $Z_1$ of a support 150. The second dispensing section 161b through the sixth dispensing section 161f are annular dispensing sections that are aligned with the first through the fifth outer regions $R_1$–$R_5$ of the workpiece W, which are in turn aligned with the second through the sixth zones $Z_2$–$Z_6$ of the support 150, respectively.

Figure 6G:
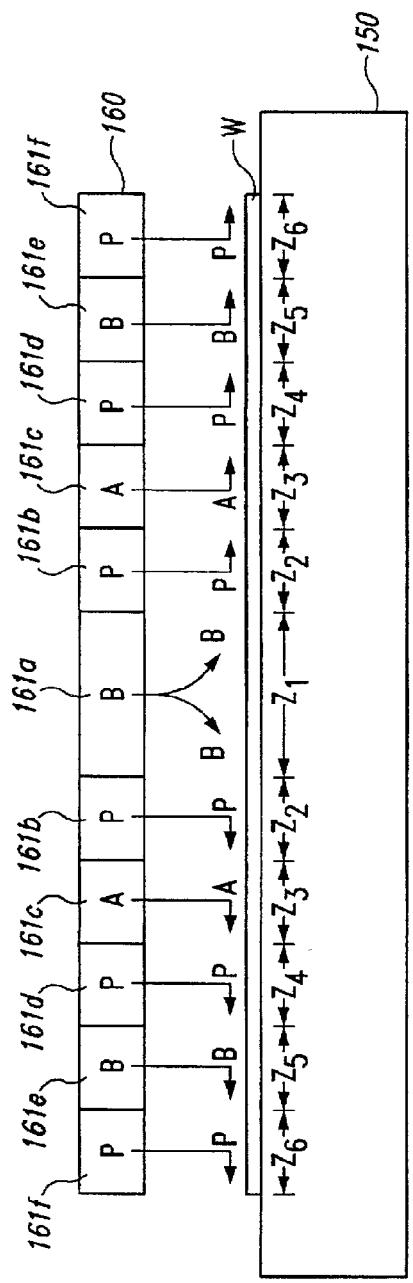
Figure 6H:
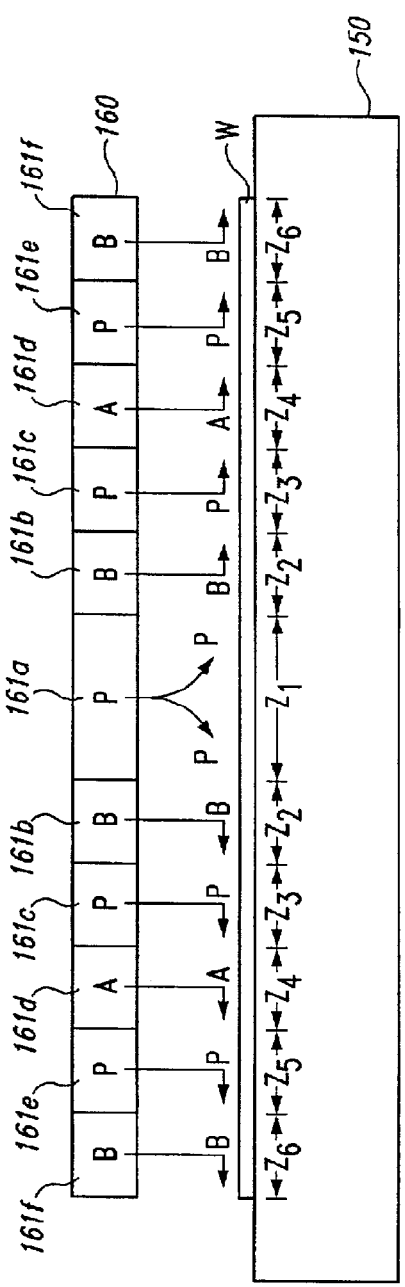
Figure 6I:
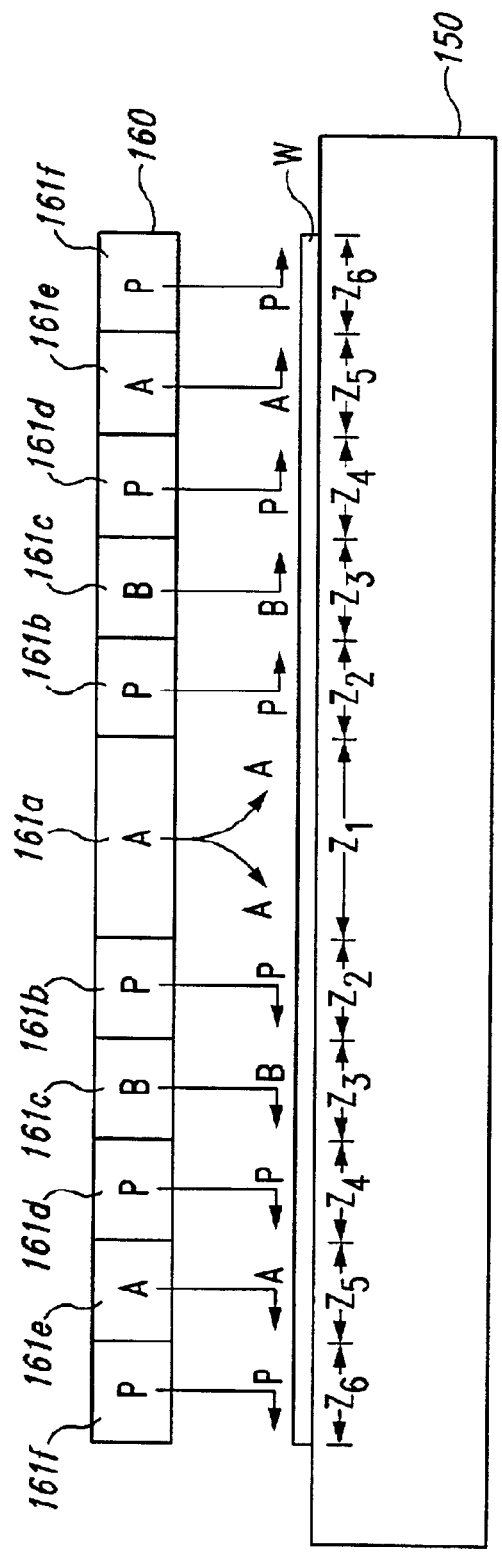

FIG. 6A illustrates an initial stage of this method in which a first pulse of the first precursor A is dispensed from the first dispensing section 161a to flow to the center region C of the workpiece W. FIG. 6B illustrates a subsequent stage in which a first pulse of the purge gas P is dispensed from the first dispensing section 161a and a second pulse of the first precursor is dispensed from the second dispensing section 161b. FIG. 6C illustrates yet another stage in which a first pulse of the second precursor B is dispensed from the first dispensing section 161a, a second pulse of the purge gas P is dispensed from the second dispensing section 161b, and a third pulse of the first precursor A is dispensed from the third dispensing section 161c. FIG. 6D illustrates a subsequent stage in which a fourth pulse of the first precursor A is dispensed from the fourth dispensing section 161d, a third pulse of the purge gas P is dispensed from the third dispensing section 161c, a second pulse of the second precursor B is dispensed from the second dispensing section 161b, and a fourth pulse of the purge gas P is dispensed from the first dispensing section 161a. FIGS. 6E–6I illustrate subsequent stages of this method in which additional pulses of the first precursor A, purge gas P, and second precursor B are selectively and independently pulsed through the first through the sixth dispensing sections 161a–f in an order that separately exposes the various regions of the workpiece W to one precursor at a time. The progression of the pulses in the pulse train can be repeated in a similar pattern to continuously expose individual regions of the workpiece to the purge gas while exposing other regions of the workpieces to a single one of either the first precursor A or the second precursor B.

The embodiment of method set forth in FIGS. 6A–6I is expected to produce similar results and have similar benefits as the methods described above with reference to FIGS. 5A–5F. One possible difference that may occur is that the pulses in the method set forth in FIGS. 6A–6I may be controlled more accurately because the surface area on the workpiece of each pulse is smaller. The higher resolution of pulses may accordingly provide better results and more control over the ALD process.

C. Gas Distributors

FIG. 7 is a cross-sectional view of a gas distributor 160a having a first dispensing section 161a and a second dispensing section 161b. The gas distributor 160a includes a gas box 164, a divider 165 in the gas box 164, and a distributor plate 170. The divider 165 can be an annular wall in the gas box 164 that defines a first compartment 166 and a second compartment 168. The first compartment 166 can be a central compartment having a circular shape, and the second compartment 168 can be an annular compartment that is located radially outward from the first compartment 166. The first and second compartments 166 and 168 are coupled to gas lines that can independently provide the first precursor A, the second precursor B or the purge gas P to the first or second compartments 166 or 168. The distributor plate 170 has a plurality of passageways 172 through which the gas can flow from the compartments 166 and 168 downward toward the workpiece (not shown in FIG. 7).

In operation, a pulse of one type of gas flows through the first compartment 166 while a pulse of a different type of gas simultaneously flows through the second compartment 168 to provide the pulse trains described above with reference to FIGS. 5A–5E. The gas distributor 160a can include more than two compartments, such as one having six compartments to perform the particular embodiments of the methods set forth in FIGS. 6A–6I. It will be appreciated that the gas distributor 160a can have several other configurations in which the first precursor A, the second precursor B, and the purge gas P can be selectively dispensed from different portions of the distributor plate 170.

FIG. 8 illustrates an embodiment of another gas distributor 160 for use in the system 100 (FIG. 4). In this embodiment, the gas distributor 160b includes a circular first dispensing section 161a and an annular second dispensing section 161b outside of the first dispensing section 161a. The gas distributor 160 can include a gas box 164 and a distributor plate 170. The distributor plate 170 includes a plurality of passageways 172. The gas distributor 160b further includes a plurality of dedicated conduits or gas lines 173, 174 and 175 that are coupled to individual passageways 172. Each of the gas lines 173 in the first and second dispensing sections 161a and 161b can be coupled to different valves that independently supply the purge gas P to a purge set of the passageways 172 in the first dispensing section 161a and purge set of passageways 172 in the second dispensing section 161b. The gas lines 174 in the first and second dispensing sections 161a and 161b can be coupled to different valves that independently provide the first precursor A to a first precursor set of passageways 172 in the first dispensing section 161a and a first precursor set of passageways 172 in the second dispensing section 161b. The gas lines 175 can be coupled to different valves that independently provide the second precursor B to a second precursor set of passageways 172 in the first dispensing section 161a and a second precursor set of passageways 172 in the second dispensing section 161b. As a result, each passageway 172 in the distributor plate 170 is dedicated to dispensing one type of gas to the workpiece. This is expected to reduce mixing of the first and second precursors A and B within the gas distributor 160 to enhance the quality of the film that is deposited onto the workpiece.

From the foregoing, it will be appreciated that specific embodiments of the invention have been described herein for purposes of illustration, but that various modifications may be made without deviating from the spirit and scope of the invention. For example, although the foregoing embodiments illustrate circular reactors and gas distributors, several aspects of the invention are also useful in linear reactors. The methods, therefore, can include dispensing independent pulses of gases linearly over first and second regions of a workpiece. Several embodiments of the invention may also be used in other geometries according to the shape of the reactor and the gas distributor. Accordingly, the invention is not limited except as by the appended claims.

We claim:

1. A method of forming a layer on a micro-device workpiece having a center region and at least a first outer region radially outward from the center region, the method comprising:
    dispensing a first pulse of a first precursor over the center region of the workpiece;
    dispensing a first pulse of a purge gas over the center region of the workpiece after terminating the first pulse of the first precursor, and dispensing a second pulse of the first precursor over the first outer region of the workpiece concurrently while dispensing the first pulse of the purge gas;
    dispensing a first pulse of a second precursor over the center region of the workpiece after terminating the first pulse of the purge gas, and dispensing a second pulse of the purge gas over the first outer region of the workpiece while concurrently dispensing the first pulse of the second precursor; and
    dispensing a third pulse of the purge gas over the center region of the workpiece after terminating the first pulse of the second precursor, and dispensing a second pulse of the second precursor over the, first outer region of the workpiece while concurrently dispensing the third pulse of the purge gas.

2. The method of claim 1 wherein all of the dispensing procedures are repeated in serial order until a layer having the desired thickness is formed on the workpiece.

3. The method of claim 1, further comprising providing a gas distributor comprising a first dispensing section over the center region of the workpiece and a second dispensing section over the first outer region of the workpiece, and wherein:
    dispensing the first pulse of the first precursor comprises flowing the first precursor through the first dispensing section.

4. The method of claim 1, further comprising providing a gas distributor comprising a first dispensing section over the center region of the workpiece and a second dispensing section over the first outer region of the workpiece, and wherein:
    dispensing the first pulse of the purge gas comprises flowing the purge gas through the first dispensing section; and
    dispensing the second pulse of the first precursor comprises flowing the first precursor through the second dispensing section.

5. The method of claim 1, further comprising providing a gas distributor comprising a first dispensing section over the center region of the workpiece and a second dispensing section over the first outer region of the workpiece, and wherein:
    dispensing the first pulse of the second precursor comprises flowing the second precursor through the first dispensing section; and
    dispensing the second pulse of the purge gas comprises flowing the purge gas through the second dispensing section.

6. The method of claim 1, further comprising providing a gas distributor comprising a first dispensing section over the center region of the workpiece and a second dispensing section over the first outer region of the workpiece, and wherein:
    dispensing the third pulse of the purge gas comprises flowing the purge gas through the first dispensing section; and dispensing the second pulse of the second precursor comprises flowing the second precursor through the second dispensing section.

7. The method of claim 1 wherein:
dispensing the first pulse of the first precursor comprises dispensing a first concentration of the first precursor; and
dispensing the second pulse of the first precursor comprises dispensing a second concentration of the first precursor, wherein the second concentration is different than the first concentration.

8. The method of claim 7 wherein the first concentration is greater than the second concentration.

9. The method of claim 7 wherein the first concentration is less than the second concentration.

10. A method of forming a layer on a micro-device workpiece having a first region and a second region, the method comprising:
dispensing a first pulse of a first precursor at the first region of the workpiece to flow toward the second region of the workpiece;
dispensing a first pulse of a purge gas at the first region of the workpiece to flow toward the second region of the workpiece after terminating the first pulse of the first precursor, and dispensing a second pulse of the first precursor at the second region of the workpiece to flow away from the second region while dispensing the first pulse of the purge gas in the first region of the workpiece.

11. The method of claim 10, further comprising providing a gas distributor comprising a first dispensing section over the first region and a second dispensing section over the second region, and wherein:
dispensing the first pulse of the first precursor at the first region of the workpiece comprises discharging the first precursor from the first dispensing section.

12. The method of claim 10, further comprising providing a gas distributor comprising a first dispensing section over the first region and a second dispensing section over the second region, and wherein:
dispensing the first pulse of the purge gas at the first region comprises discharging the purge gas from the first dispensing section; and
dispensing the second pulse of the first precursor comprises discharging the first precursor from the second dispensing section.

13. The method of claim 10, further comprising:
dispensing a first pulse of a second precursor at the first region to flow radially outward toward the second region after terminating the first pulse of the purge gas at the first region; and
dispensing a second pulse of the purge gas at the second region to flow radially outward concurrently while dispensing the first pulse of the second precursor at the first region.

14. The method of claim 10, further comprising:
providing a gas distributor comprising a first dispensing section over the first region and a second dispensing section over the second region, wherein the first region is defined by a center region of the workpiece and the second region is defined by a first outer region of the workpiece;
dispensing a first pulse of a second precursor at the first region by discharging the second precursor from the first dispensing section; and dispensing a second pulse of the purge gas at the second region by discharging the purge gas from the second dispensing section.

15. The method of claim 10, further comprising:
providing a gas distributor comprising a first dispensing section over the first region and a second dispensing section over the second region, wherein the first region is defined by a center region of the workpiece and the second region is defined by an outer region of the workpiece;
dispensing a third pulse of the purge gas at the first region by discharging the purge gas from the first dispensing section after terminating the first pulse of second precursor; and
dispensing a second pulse of the second precursor at the second region by discharging the second precursor from the second dispensing section concurrently while discharging the third pulse of the purge gas.

16. The method of claim 10 wherein:
dispensing the first pulse of the first precursor comprises dispensing a first concentration of the first precursor; and
dispensing the second pulse of the first precursor comprises dispensing a second concentration of the first precursor, wherein the second concentration is different than the first concentration.

17. The method of claim 16 wherein the first concentration is greater than the second concentration.

18. The method of claim 16 wherein the first concentration is less than the second concentration.

19. A method of forming a layer on a micro-device workpiece having a first region and a second region radially outward from the first region, the method comprising:
flowing a first pulse of a first precursor from the first region of the workpiece to the second region of the workpiece;
flowing a first pulse of a purge gas from the first region to the second region after terminating the first pulse of the first precursor, and flowing a second pulse of the first precursor from the second region toward a peripheral edge of the workpiece concurrently while dispensing the first pulse of the purge gas.

20. The method of claim 19, further comprising providing a gas distributor comprising a first dispensing section over the first region and a second dispensing section over the second region, wherein the first region is defined by a center region of the workpiece and the second region is defined by a first outer region of the workpiece, and wherein:
flowing the first pulse of the first precursor at the first region of the workpiece comprises discharging the first precursor from the first dispensing section so that the first pulse of the first precursor flows radially outward across the workpiece.

21. The method of claim 19, further comprising providing a gas distributor comprising a first dispensing section over the first region and a second dispensing section over the second region, wherein the first region is defined by a center region of the workpiece and the second region is defined by a first outer region of the workpiece, and wherein:
flowing the first pulse of the purge gas at the first region comprises discharging the purge gas from the first dispensing section to flow radially outward across the workpiece; and
flowing the second pulse of the first precursor comprises discharging the first precursor from the second dispensing section to flow radially outward across the workpiece.

22. The method of claim 19, further comprising:

dispensing a first pulse of a second precursor at the first region to flow radially outward toward the second region after terminating the first pulse of the purge gas at the first region; and dispensing a second pulse of the purge gas at the second region to flow radially outward concurrently while dispensing the first pulse of the second precursor at the first region.

23. The method of claim 19, further comprising:

providing a gas distributor comprising a first dispensing section over the first region and a second dispensing section over the second region, wherein the first region is defined by a center region of the workpiece and the second region is defined by a first outer region of the workpiece;

dispensing a first pulse of a second precursor at the first region by discharging the second precursor from the first dispensing section; and dispensing a second pulse of the purge gas at the second region, by discharging the purge gas from the second dispensing section.

24. The method of claim 19, further comprising:

providing a gas distributor comprising a first dispensing section over the first region and a second dispensing section over the second region, wherein the first region is defined by a center region of the workpiece and the second region is defined by an outer region of the workpiece;

dispensing a third pulse of the purge gas at the first region by discharging the purge gas from the first dispensing section after terminating the first pulse of second precursor; and dispensing a second pulse of the second precursor at the second region by discharging the second precursor from the second dispensing section concurrently while discharging the third pulse of the purge gas.

25. A method of forming a layer on a micro-device workpiece having a first region and a second region radially outward from the first region, the method comprising:

depositing a first pulse of a first precursor onto the first region of the workpiece;

terminating the first pulse of the first precursor;

depositing a first pulse of a purge gas onto the first region of the workpiece after terminating the first pulse of the first precursor, wherein the first pulse of the purge gas drives a portion of the first precursor to the second region of the workpiece; and depositing a second pulse of the first precursor onto the second region of the workpiece concurrently while depositing the first pulse of the purge gas onto the first region to augment the portion of the first pulse of the first precursor flowing from the first region to the second region.

26. The method of claim 25 wherein:

dispensing the first pulse of the first precursor comprises dispensing a first concentration of the first precursor; and dispensing the second pulse of the first precursor comprises dispensing a second concentration of the first precursor, wherein the second concentration is different than the first concentration.

27. The method of claim 26 wherein the first concentration is greater than the second concentration.

28. The method of claim 26 wherein the first concentration is less than the second concentration.

29. A method of forming a layer on a micro-device workpiece having a first region and a second region, the method comprising:

dispensing a pulse train onto the workpiece to flow radially outward from the first region to the second region, the pulse train having a first pulse of a first precursor, a second pulse of a purge gas, a third pulse of a second precursor, and a fourth pulse of the purge gas; and controlling the pulses so that the purge gas is dispensed onto the workpiece in one of the first or second regions while one of the first or second precursors is dispensed onto the workpiece in the other of the first or second regions.

* * * * *

UNITED STATES PATENT AND TRADEMARK OFFICE
CERTIFICATE OF CORRECTION

PATENT NO. : 6,861,094 B2
DATED : March 1, 2005
INVENTOR(S) : Garo J. Derderian et al.

It is certified that error appears in the above-identified patent and that said Letters Patent is hereby corrected as shown below:

<u>Title page,</u>
Item [56], References Cited, FOREIGN PATENT DOCUMENTS, insert
-- DE 19851824 A1 Siemens AG 5/11/2000 --.

Signed and Sealed this

Sixteenth Day of August, 2005

JON W. DUDAS
*Director of the United States Patent and Trademark Office*